United States Patent
Kawamura et al.

(10) Patent No.: US 10,535,397 B1
(45) Date of Patent: Jan. 14, 2020

(54) SENSING TECHNIQUES FOR MULTI-LEVEL CELLS

(71) Applicant: Micron Technology, Inc., Boise, ID (US)

(72) Inventors: Christopher John Kawamura, Boise, ID (US); Scott James Derner, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/107,280

(22) Filed: Aug. 21, 2018

(51) Int. Cl.
| | | |
|---|---|---|
| G11C 11/4091 | (2006.01) | |
| G11C 7/06 | (2006.01) | |
| G11C 11/408 | (2006.01) | |
| G11C 11/4076 | (2006.01) | |
| G11C 7/08 | (2006.01) | |
| G11C 11/4097 | (2006.01) | |
| H01L 27/108 | (2006.01) | |

(52) U.S. Cl.
CPC .......... G11C 11/4091 (2013.01); G11C 7/062 (2013.01); G11C 7/08 (2013.01); G11C 11/4076 (2013.01); G11C 11/4087 (2013.01); G11C 11/4097 (2013.01); H01L 27/10897 (2013.01)

(58) Field of Classification Search
CPC ............................ G11C 7/062; G11C 11/4091
USPC ....................................................... 365/208
See application file for complete search history.

(56) References Cited

U.S. PATENT DOCUMENTS

| | | | | |
|---|---|---|---|---|
| 6,982,904 | B2* | 1/2006 | Shiga .................. | G06F 11/1068 365/185.09 |
| 7,701,777 | B2* | 4/2010 | Ogawa .................. | G11C 7/065 365/185.21 |
| 8,004,903 | B2* | 8/2011 | Ogawa .................. | G11C 7/065 365/185.21 |
| 8,040,714 | B2* | 10/2011 | Choi ....................... | G11C 11/56 365/100 |
| 8,050,084 | B2* | 11/2011 | Bae ......................... | G11C 7/04 365/163 |
| 8,081,501 | B2* | 12/2011 | Choi ........................ | G11C 8/10 365/148 |
| 9,082,478 | B2* | 7/2015 | Lee ....................... | G11C 13/004 |
| 10,083,746 | B2* | 9/2018 | Park .................... | G11C 13/0026 |
| 10,304,550 | B1* | 5/2019 | Nguyen ............. | G11C 16/3431 |

* cited by examiner

*Primary Examiner* — Son L Mai
(74) *Attorney, Agent, or Firm* — Holland & Hart LLP

(57) ABSTRACT

Techniques are provided for sensing a memory cell configured to store three or more states. A charge may be transferred between a digit line and a node coupled with a sense component using a charge transfer device. During a single read operation, multiple voltages may be applied to the gate of the charge transfer device. The node may be sensed a number of times based on a number of voltages applied to the gate of the charge transfer device. The charge may be transferred by the charge transfer device based on a value of the signal on a digit line and a voltage applied to the gate of the charge transfer device. Based on the charge being transferred and the sense component sensing the node multiple times, a logic state associated with the memory cell may be determined.

18 Claims, 9 Drawing Sheets

SENSING TECHNIQUES FOR MULTI-LEVEL CELLS

BACKGROUND

The following relates generally to a system that includes at least one memory device and more specifically to sensing techniques for multi-level cells.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Volatile memory devices, e.g., DRAM, may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Sensing a signal associated with such a memory cell capable of storing multiple states may be desired to more accurately determine the logic state stored to the memory cell and increase reliability during a read operation, among other benefits.

DETAILED DESCRIPTION

Figure 1:
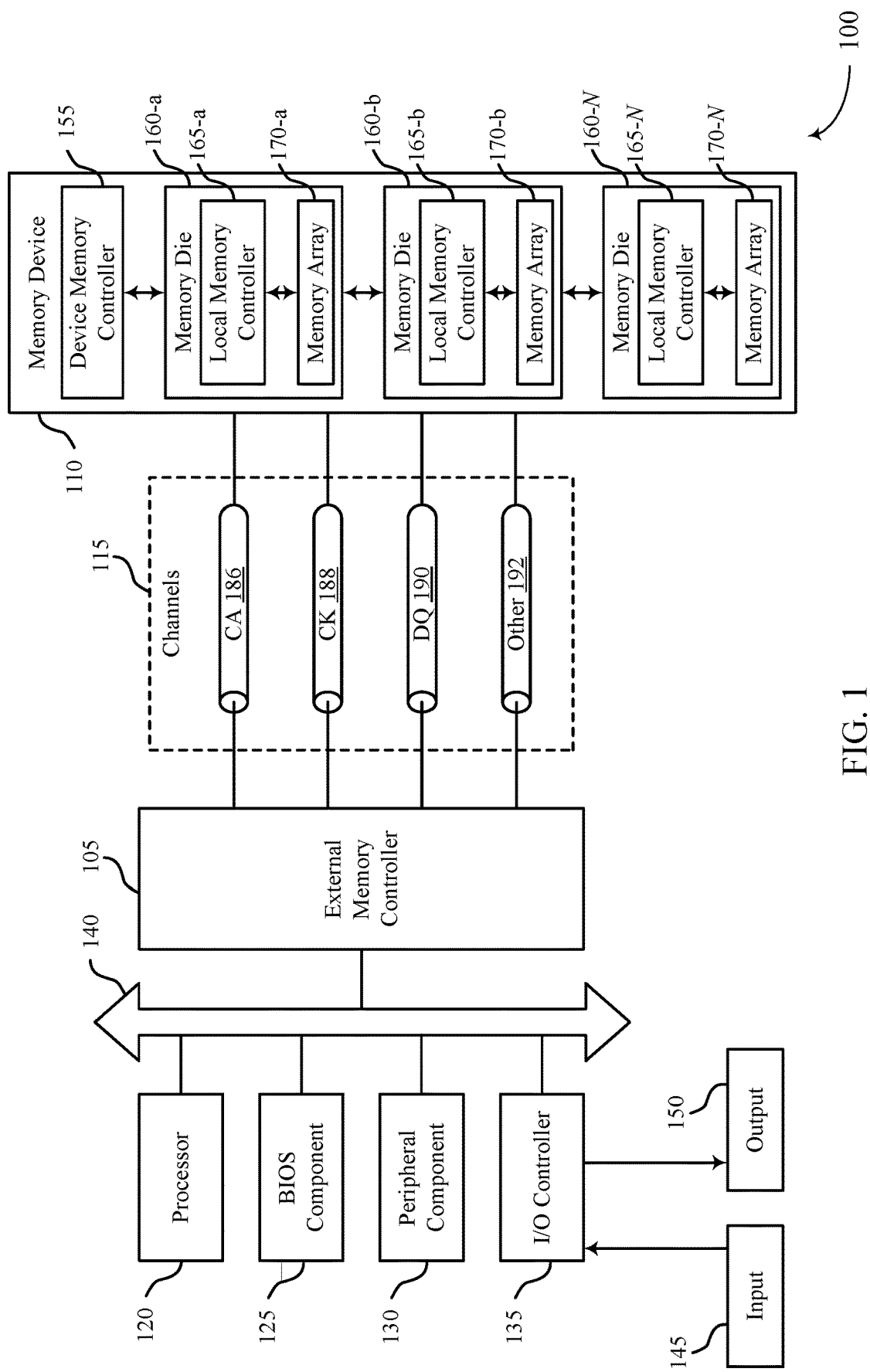
FIG. 1 illustrates an example of a system that supports sensing techniques for multi-level cells in accordance with aspects of the present disclosure.

A memory cell capable of storing three or more states (e.g., a multi-level memory cell) may be configured to store more than one bit of digital data and may be sensed multiple times during a read operation using a charge transfer device. To sense a multi-level memory cell, a sense component may sense a node multiple times during a single read operation to improve the overall accuracy of the read operation. Sensing multiple times during a read operation may prevent unwanted or unintentional disturbances on a digit line, which may otherwise lead to degradation of data stored to one or more memory cells. Based on the particular logic state stored to the memory cell, the charge transfer device may couple a digit line associated with the memory cell to a sense component, which may conduct multiple sense operations during a single read operation.

Techniques are provided for sensing a multi-level memory cell. In some examples, a multi-level memory cell may store multiple logic states, such as three logic states (e.g., logic 00, 01, 11) and, in other examples, a multi-level memory cell may store four or more logic states (e.g., logic 00, 01, 10, 11). To sense a logic state of the multi-level memory cell, multiple gate voltages may be applied to a gate of a charge transfer device. The charge transfer device may be coupled with the digit line and the node, such that when a voltage of the digit line (e.g., due to the multi-level memory cell being discharged onto the digit line) is less than a voltage of a gate of the charge transfer device, the charge is transferred to a node coupled with the sense component. The logic state stored in the multi-level memory cell may be determined based on when the charge is transferred or a gate voltage applied to the gate of the charge transfer device when the charge is transferred.

When sensing a multi-level memory cell configured to store three or more logic states, various sensing schemes may be used. For example, a voltage of the gate of the charge transfer device and the node of the sense component may each be precharged (e.g., during a compensation phase). The multi-level memory cell may then be discharged onto the digit line. Depending on the logic state stored to the memory cell and the voltage applied to the gate of the charge transfer device, the charge may be transferred to the node. The sense component may sense a voltage of the node to determine a logic state of the memory cell after at least one of the gate voltages is applied to the gate of charge transfer device. Accordingly, a correlation may exist between the number of sense operations that occur during a single read operation and the number of logic states that a particular memory cell is configured to store.

Features of the disclosure are initially described in the context of a memory system. Features of the disclosure are described in the context of a memory die, a circuit, and a flow diagram that support sensing techniques for multi-level cells in accordance with aspects of the present disclosure. These and other features of the disclosure are further illustrated by and described with reference to an apparatus diagram and flowcharts that relate to sensing techniques for multi-level cells.

FIG. 1 illustrates an example of a system 100 that utilizes one or more memory devices in accordance with aspects disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 125 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. The peripheral component(s) 125 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein. In some examples, memory device 110 may be coupled with one or more sense components. Each memory cell, for example, may be coupled with the sense components via a digit line coupled with a charge transfer device (e.g., a transistor). The gate of the charge transfer device may be coupled with a voltage source (e.g., $V_{read}$) and a compensation device (e.g., a second transistor) configured to compensate for a threshold voltage associated with the charge transfer device. In some examples, the charge transfer device may be configured to transfer a charge between the digit line and a node of the sense component based on a memory cell being discharged onto the digit line. Subsequently, the sense component may sense a voltage of the node multiple times (e.g., via multiple strobes during a single read operation) to determine a logic state of the memory cell.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. As described above, the memory device 110 may be coupled with one or more sense components configured to sense a voltage of a node multiple times during a single read operation. For example, each memory cell (e.g., of a respective memory array) may be coupled with the sense component via a digit line and a charge transfer device (e.g., a transistor). In some examples, the gate of the charge transfer device may be coupled with a voltage source configured to adjust a voltage of the gate of the charge transfer device. The charge transfer device may be coupled with a compensation device (e.g., a second transistor) and a capacitor configured to compensate for a threshold voltage associated with the charge transfer device.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any number of memory dice 160-N). In a 3D memory device, a plurality of memory dice 160-N may be stacked on top of one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the number of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120).

In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like. In some examples, the device memory controller 155 may be configured to control the operations of a memory array as it relates to a read operation using a charge transfer device. For example each memory cell of memory array 170-a may be coupled with a node of a sense component via a respective digit line. In some examples, the digit line may be coupled with a charge transfer device configured to transfer a charge between the digit line and the node based on a memory cell being discharged onto the digit line.

In some examples, the memory cell may be sensed by the local memory controller 165 after biasing a gate of the charge transfer device to a first voltage. The voltage may be or may be equivalent to, for example, a read voltage (e.g., $V_{read}$) plus a threshold voltage of the charge transfer device (e.g., $V_t$). The local memory controller 165 may apply an additional voltage (e.g., $V_{cc}$) to a node coupled with a sense component to precharge the node. In some examples, $V_{read}$ may be a same voltage as $V_{cc}$. This may be referred to as a compensation phase of a read operation. The local memory controller 165 may discharge the memory cell onto the digit line. Depending on the logic state stored to the memory cell (e.g., depending on the charge discharged onto the digit line), the charge transfer device may transfer the charge to the node, and the sense component may subsequently sense a voltage on the node. The local memory controller 165 may then bias the gate of the charge transfer device to a second voltage, and subsequently discharge the memory cell onto the digit line. The number of times the node is sensed may be associated with a number of states that the memory cell is configured to store. Stated another way, a sense component may strobe n−1 times during a single read operation, where n is the number of states a particular memory cell is configured to store. So if a memory cell is configured to store four logic states (e.g., "00", "01", "10", and "11"), the sense component may conduct three strobes (e.g., three sense operations) during a single read operation in order to determine the logic state of the memory cell. In some cases where the sense component is configured to store four logic states, three different voltages may be applied to a gate of the charge transfer device.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), etc.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include eight or nine signal paths.

In some cases, the channels 115 may include one or more clock signal (CK) channels 188. The CK channels 188 may be configured to communicate one or more common clock signals between the external memory controller 105 and the memory device 110. Each clock signal may be configured oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. In some cases, the clock signal may be a 1.5 GHz signal. A CK channel 188 may include any number of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, the channels 115 may include one or more other channels 192 that may be dedicated to other purposes. These other channels 192 may include any number of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any number of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any number of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols. As indicated herein and described with reference to FIGS. 3 and 4, the sensing scheme described may be performed with respect to multi-level memory cells.

Figure 2:
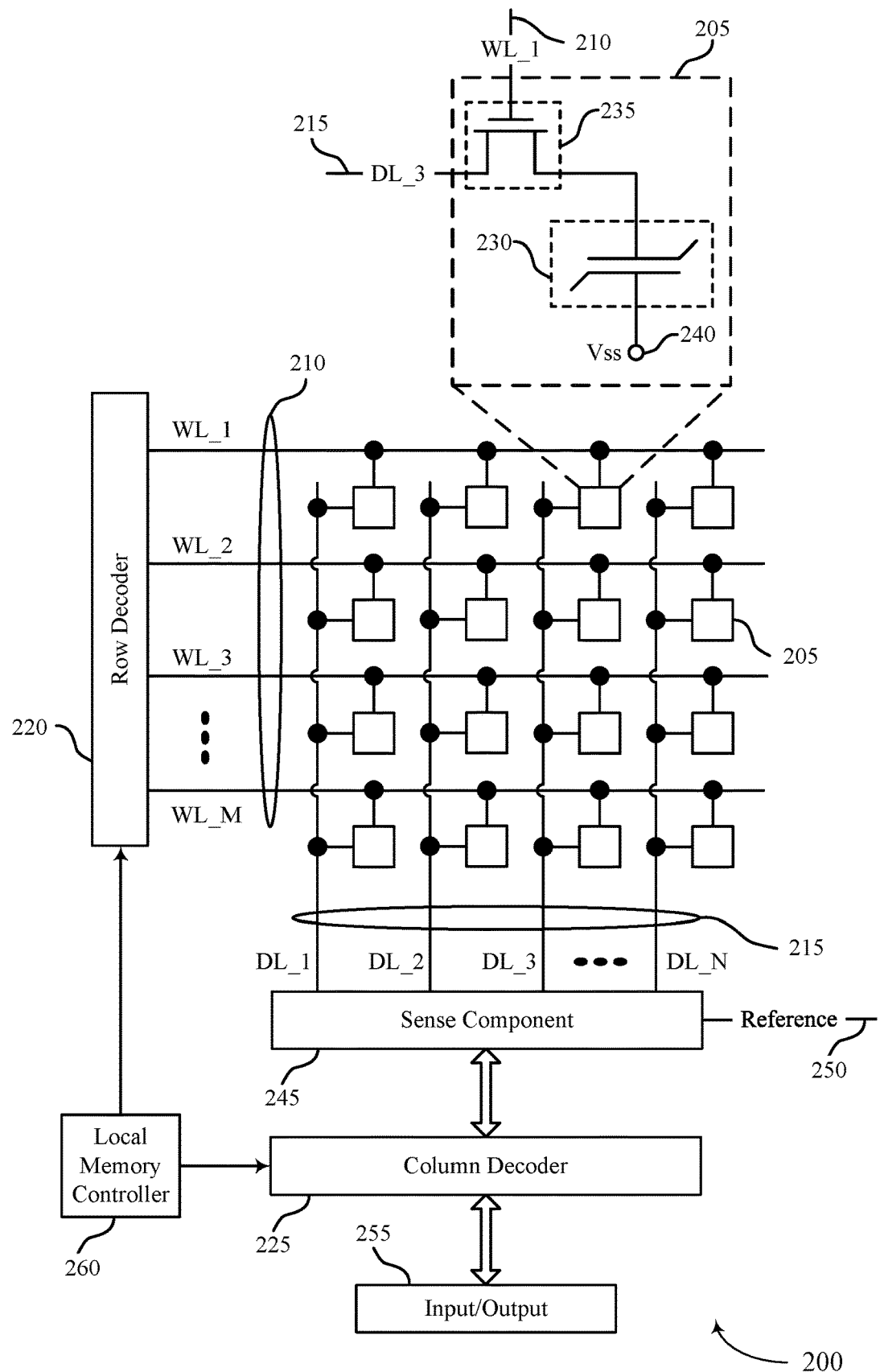
FIG. 2 illustrates an example of a memory die that supports sensing techniques for multi-level cells in accordance with aspects of the present disclosure.

FIG. 2 illustrates an example of a memory die 200 in accordance with various examples of the present disclosure. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a charge representative of the programmable states in a capacitor. DRAM architectures may include a capacitor that includes a dielectric material to store a charge representative of the programmable state. In some examples, the digit line may include (e.g., be coupled with) a charge transfer device configured to transfer charge between the digit line and the node of the sense component during a read operation. The charge transfer device may be implemented in order to improve sensing capabilities of memory cell 205 (e.g., of a multi-level memory cell configured to store three or more logic states). In some examples, a charge representable of the programmable states may be transferred to the node—via the charge transfer device—and may be sensed by the sense component 245. The charge may partially represent, for example, one of four logic states stored to the memory cell 205 (e.g., logic "00", logic "01", logic "10", or "logic" 11). The number of sense operations (e.g., the number of strobes) conducted by the sense component 245 may be associated with the number of logic states that the memory cell 205 is configured to store. As described above with reference to FIG. 1, the number of sense operations conducted during a single read operation may be n−1, where n is the number of logic states that the memory cell 205 is configured to store. So if memory cell 205 is configured to store three logic states (e.g., "00", "mid", and "11") then sense component 245 may be strobed twice during a single read operation.

Operations such as reading and writing may be performed on memory cells 205 by activating or selecting access lines such as a word line 210 and/or a digit line 215. In some cases, digit lines 215 may also be referred to as bit lines. References to access lines, word lines and digit lines, or their analogues, are interchangeable without loss of understanding or operation. Activating or selecting a word line 210 or a digit line 215 may include applying a voltage to the respective line.

The memory die 200 may include the access lines (e.g., the word lines 210 and the digit lines 215) arranged in a grid-like pattern. Memory cells 205 may be positioned at intersections of the word lines 210 and the digit lines 215. By biasing a word line 210 and a digit line 215 (e.g., applying a voltage to the word line 210 or the digit line 215), a single memory cell 205 may be accessed at their intersection.

Accessing the memory cells 205 may be controlled through a row decoder 220, a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address. For example, the memory die 200 may include multiple word lines 210, labeled WL_1 through WL_M, and multiple digit lines 215, labeled DL_1 through DL_N, where M and N depend on the size of the memory array. Thus, by activating a word line 210 and a digit line 215, e.g., WL_1 and DL_3, the memory cell 205 at their intersection may be accessed. The intersection of a word line 210 and a digit line 215, in either a two-dimensional or three-dimensional configuration, may be referred to as an address of a memory cell 205.

The memory cell 205 may include a logic storage component, such as capacitor 230 and a switching component 235. The capacitor 230 may be an example of a dielectric capacitor or a ferroelectric capacitor. A first node of the capacitor 230 may be coupled with the switching component 235 and a second node of the capacitor 230 may be coupled with a voltage source 240. In some cases, the voltage source 240 is a ground such as Vss. In some cases, the voltage source 240 may be an example of a plate line coupled with a plate line driver. The switching component 235 may be an example of a transistor or any other type of switch device that selectively establishes or de-establishes electronic communication between two components. In some examples, memory cell 205 may be a multi-level memory cell or may be referred to as a multi-level memory cell. Stated another way, memory cell 205 may be configured to store three or more states (e.g., three or more logic states).

Selecting or deselecting the memory cell 205 may be accomplished by activating or deactivating the switching component 235. The capacitor 230 may be in electronic communication with the digit line 215 using the switching component 235. For example, the capacitor 230 may be isolated from digit line 215 when the switching component 235 is deactivated, and the capacitor 230 may be coupled with digit line 215 when the switching component 235 is activated. In some cases, the switching component 235 is a transistor and its operation may be controlled by applying a voltage to the transistor gate, where the voltage differential between the transistor gate and transistor source may be greater or less than a threshold voltage of the transistor. In some cases, the switching component 235 may be a p-type transistor or an n-type transistor. The word line 210 may be in electronic communication with the gate of the switching component 235 and may activate/deactivate the switching component 235 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 235 of a memory cell 205 and may be configured to control the switching component 235 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be configured to couple and/or isolate the capacitor 230 of the memory cell 205 and the digit line 215. In some architectures, the memory cell 205 may be in electronic communication (e.g., constant) with the digit line 215.

As described above, the digit line 215 may be coupled with a charge transfer device (e.g., a transistor), which may be coupled with the sense component 245. In some examples, the digit line 215 may be configured to receive a charge from (e.g., to be biased by) memory cell 205. Stated another way, memory cell 205 may be discharged onto digit line 215, which may bias the digit line to a particular voltage. The voltage of the digit line may thus be representative of or related to a logic state stored to memory cell 205. For example, if memory cell 205 were to store a logic "0" and be discharged onto digit line 215, the digit line may be biased to a different voltage than if memory cell 205 were to store a logic "1" and be discharged onto digit line 215. The sense component 245 may sense a voltage of the node multiple times during a single read operation, which may determine a logic state of the memory cell 205.

The sense component 245 may be configured to detect state (e.g., a charge) stored on the capacitor 230 of the memory cell 205 and determine a logic state of the memory cell 205 based on the stored state. The charge stored by a memory cell 205 may be extremely small, in some cases. As such, the sense component 245 may include one or more sense amplifiers to amplify the signal output by the memory cell 205. The sense amplifiers may detect small changes in the charge of a digit line 215 during a read operation and may produce signals corresponding to a logic state 0 or a logic state 1 based on the detected charge.

During a read operation, the capacitor 230 of memory cell 205 may output a signal (e.g., discharge a charge) to its corresponding digit line 215. The signal may cause a voltage of the digit line 215 to change. The sense component 245 may be configured to compare the signal received from the memory cell 205 across the digit line 215 to a reference signal 250 (e.g., reference voltage). The sense component 245 may determine the stored state of the memory cell 205 based on the comparison. For example, in binary-signaling, if digit line 215 has a higher voltage than the reference signal 250, the sense component 245 may determine that the stored state of memory cell 205 is a logic 1 and, if the digit line 215 has a lower voltage than the reference signal 250, the sense component 245 may determine that the stored state of the memory cell 205 is a logic 0. The sense component 245 may include various transistors or amplifiers to detect and amplify a difference in the signals. The detected logic state of memory cell 205 may be output through column decoder 225 as output 255. In some cases, the sense component 245 may be part of another component (e.g., a column decoder 225, row decoder 220). In some cases, the sense component 245 may be in electronic communication with the row decoder 220 or the column decoder 225. In some examples, multiple sense components may be coupled with memory cell 205, and each memory cell may be configured to sense a voltage of a node coupled thereto.

As described above, memory cell 205 may be discharged onto digit line 215 during single read operation. In some examples, depending on a voltage of the gate of the charge transfer device (e.g., $V_{read}+V_t$), the charge transfer device may transfer the resulting charge to the node. Accordingly, the node may discharge at a rate that is related to an amount of charge that is transferred. The sense component 245 may sense the voltage of the node (e.g., after each time the voltage of the gate of the charge transfer device is changed), described below with reference to FIGS. 3 and 4, to determine the logic state of the memory cell. For example, the sense component 245 may be configured to sense a voltage (e.g., a signal) on the node using a fixed reference voltage.

In some examples, the sense component 245 may sense the node multiple times during a single read operation. For example, if memory cell 205 is configured to store three logic states, the sense component 245 may sense the node twice during the read operation (e.g., strobe the sense component 245). In some examples, a different voltage may be applied to the gate of the charge transfer device for each time the node is sensed. In some examples, a charge transfer device may improve a quality of the signal (e.g., of the charge) transferred to the node, and conducting multiple strobes during a single read operation may increase the accuracy of the read operation and prevent data stored to the memory cell 205 from being degraded (e.g., due to an inaccurate read/writeback operation).

For example, the signal transferred to the node may be amplified such that the difference between a reference voltage and the signal is greater, resulting in a more accurate determination of the logic state of the memory cell 205. Additionally or alternatively, a single sense component 245 may be configured to conduct multiple strobes during a single read operation, which may reduce an overall size of the memory die (e.g., due to fewer sense components being implemented).

The local memory controller 260 may control the operation of memory cells 205 through the various components (e.g., row decoder 220, column decoder 225, and sense component 245). The local memory controller 260 may be an example of the local memory controller 165 described with reference to FIG. 1. In some cases, one or more of the row decoder 220, column decoder 225, and sense component 245 may be co-located with the local memory controller 260.

The local memory controller 260 may be configured to receive commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 260 may generate row and column address signals to activate the target word line 210 and the target digit line 215. The local memory controller 260 may also generate and control various voltages or currents used during the operation of the memory die 200. In general, the amplitude, shape, or duration of an applied voltage or current discussed herein may be adjusted or varied and may be different for the various operations discussed in operating the memory die 200.

The local memory controller 260 may cause a charge to be transferred between the digit line 215 and a node coupled with the sense component 245 multiple times during a single read operation. In some examples, a compensation phase may occur, where the node is precharged (e.g., by local memory controller 260 applying a voltage to the node) and the gate of the charge transfer device is biased to a first voltage (e.g., by local memory controller 260 applying a voltage to the gate of the charge transfer device).

The local memory controller 260 may discharge the memory cell 205 onto the digit line 215 and, depending on the resulting charge, the charge transfer device may transfer the charge to the node. The local memory controller 260 may initiate a sense operation (e.g., a strobe) of the resulting voltage of the node. In some examples, the local memory controller 260 may bias the gate of the charge transfer device and initiate a sensing of the voltage of the node multiple times during a single read operation to determine a logic state of the memory cell 205. In some cases, the gate of the charge transfer device may be biased to different gate voltages each time the sense component 245 is activated or strobed.

In some cases, the local memory controller 260 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 260 may identify a target memory cell 205 on which to perform the write operation. The local memory controller 260 may identify a target word line 210 and a target digit line 215 in electronic communication with the target memory cell 205 (e.g., the address of the target memory cell 205). The local memory controller 260 may activate the target word line 210 and the target digit line 215 (e.g., applying a voltage to the word line 210 or digit line 215), to access the target memory cell 205. The local memory controller 260 may apply a specific signal (e.g., voltage) to the digit line 215 during the write operation to store a specific state (e.g., charge) in the capacitor 230 of the memory cell 205, the specific state (e.g., charge) may be indicative of a desired logic state.

In some cases, the local memory controller 260 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 260 may identify a target memory cell 205 on which to perform the read operation. The local memory controller 260 may identify a target word line 210 and a target digit line 215 in electronic communication with the target memory cell 205 (e.g., the address of the target memory cell 205).

The local memory controller 260 may activate the target word line 210 and the target digit line 215 (e.g., applying a voltage to the word line 210 or digit line 215), to access the target memory cell 205. The target memory cell 205 may transfer a signal to a node of the sense component 245 (e.g., via a charge transfer device) in response to biasing the access lines. The sense component 245 may amplify the signal. The local memory controller 260 may activate the sense component 245 (e.g., latch the sense component) multiple times during a single read operation and thereby compare the signals received from the memory cell 205 to the reference signal 250. Based on that comparison, the sense component 245 may determine a logic state that is stored on the memory cell 205. The local memory controller 260 may communicate the logic state stored on the memory cell 205 to the external memory controller 105 (or the device memory controller 155) as part of the read operation.

In some memory architectures, accessing the memory cell 205 may degrade or destroy the logic state stored in a memory cell 205. For example, a read operation performed in DRAM architectures may partially or completely discharge the capacitor of the target memory cell. The local memory controller 260 may perform a re-write operation or a refresh operation to return the memory cell to its original logic state. The local memory controller 260 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
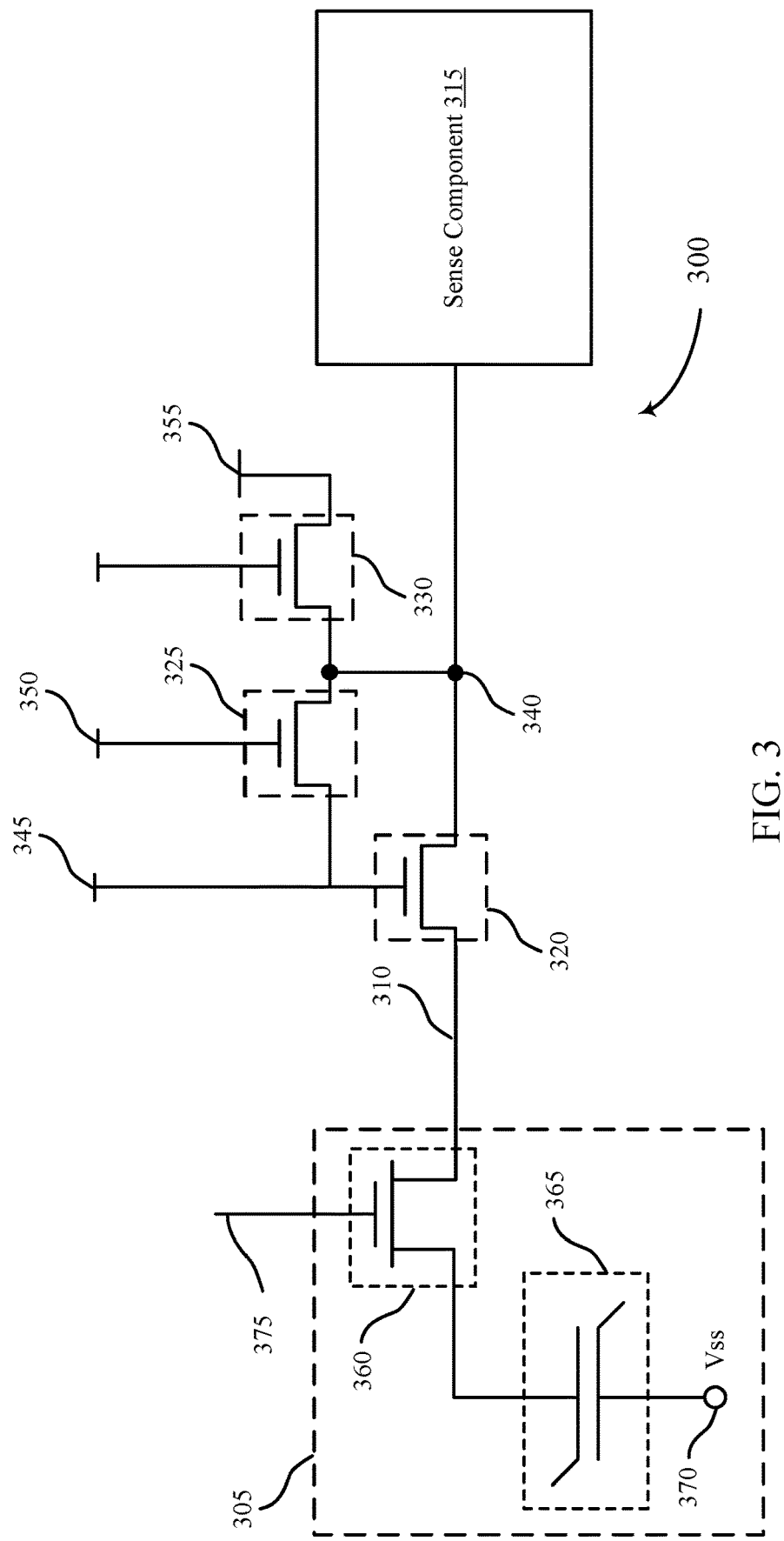
FIG. 3 illustrates an example circuit that supports sensing techniques for multi-level cells in accordance with aspects of the present disclosure.

FIG. 3 illustrates an example of a circuit 300 that supports sensing techniques for multi-level cells in accordance with aspects of the present disclosure. In some examples, circuit 300 may include one or more components described above with reference to FIGS. 1 and 2. For example, circuit 300 may include a memory cell 305, which may be an example of memory cell 205 as described with reference to FIG. 2; a digit line 310, which may be an example of digit line 215 as described with reference to FIG. 2; and a sense component 315, which may be an example of sense component 245 as described with reference to FIG. 2. Circuit 300 may include a charge transfer device 320, a compensation device 325, a transistor 330 (e.g., a first transistor), a transistor 335 (e.g., a second transistor), and a node 340. In some examples, the charge transfer device 320 may be coupled with a voltage source 345 (e.g., $V_{read}$), the compensation device 325 may be coupled with a voltage source 350 (e.g., $V_{cceq}$), and the transistor 330 may be coupled with a voltage source 355 (e.g., $V_{cc}$). The memory cell 305 may include a transistor (e.g., a switching component) 360, a capacitor 365, a voltage source 370, and a word line 375.

In some examples, memory cell 305 may be indirectly coupled with the node 340, which may be coupled with the sense component 315. For example, the memory cell 305 may be coupled with digit line 310, which may be coupled with the charge transfer device 320. In some examples, the memory cell 305 may be discharged onto digit line 310 during a read operation. The resulting charge on the digit line 310 may be transferred to node 340 by way of the charge transfer device 320. The transfer may occur, in part, based on whether and/or to what extent the resulting charge on the digit line 310 is less than a voltage applied to the gate of the charge transfer device 320 (e.g., from voltage source 345).

The charge transfer device 320 may be coupled with voltage source 345, compensation device 325, and the node 340. The charge transfer device 320 may be, in some examples, a transistor. A gate of the charge transfer device 320 may be coupled with the voltage source 345, a source of the charge transfer device 320 may be coupled with the memory cell 305 (e.g., via the digit line 310), and a drain of the charge transfer device 320 may be coupled with the node 340 (e.g., the node of the sense component 315). The charge transfer device 320 may be configured to transfer a charge (e.g., a charge received at its source) based on a voltage of the digit line 310 being less than a voltage of the gate of the charge transfer device 320. During a read operation, different voltages may be applied to the gate of the charge transfer device 320. The amount of charge transferred by the charge transfer device 320 may vary based on which voltage is applied to the gate. For example, if a first voltage is applied to the gate, the charge transfer device 320 may transfer little to no charge, but, if a second voltage is applied to the gate, the charge transfer device 320 may transfer a larger amount of charge.

In some cases, voltage source 345 may apply a read voltage (e.g., $V_{read}$) to the gate of the charge transfer device 320. Accordingly, the resulting voltage on the gate may be $V_{read}$, which may account for the threshold voltage of the charge transfer device 320 (e.g., $V_t$). Stated another way, the resulting voltage on the gate may be such that the charge transfer device 320 is activated (e.g., it is turned to an "on" position). With the charge transfer device 320 being activated, the device may transfer one or more charges to the node 340 to be sensed by the sense component 315.

A read operation performed by the circuit 300 may include, for example, a compensation phase to precharge one or more components of the circuit 300. In some examples, the compensation phase may be used to precharge the gate of the charge transfer device 320 to a respective precharge voltage (e.g., $V_{read}+V_t$). For example, to precharge the gate of the charge transfer device 320, a first voltage from the voltage source 345 (e.g., $V_{read}$) may be applied to the gate of the charge transfer device 320 and a second voltage from the voltage source 350 (e.g., $V_{cceq}$) may be applied to the gate of the compensation device 325. The voltages may be applied, in some examples, concurrently. By applying the voltage to the gate of the charge transfer device 320, the resulting gate voltage may be approximately 0.85V. By applying the voltage to the gate of the compensation device 325, the resulting gate voltage may be approximately 1.8V. After applying the first and second voltages, node 340 may be biased to the first voltage (e.g., $V_{read}$) and the resulting voltage of the digit line 310 may be a difference between the voltage on the gate of the charge transfer device 320 and a threshold voltage (e.g., $V_t$) of the charge transfer device 320 (e.g., $V_{read}-V_t$).

In some examples, a read operation may begin after the compensation phase. The read operation may begin with a cell dump phase, that may be used to dump the state (e.g., the charge) of the memory cell 305 onto the digit line 310. In some examples, the compensation phase and the cell dump phase may be performed serially. During the cell dump phase, the transistor 360 may be activated thereby coupling the capacitor 365 of the memory cell 305 to the digit line 310. The memory cell 305 may then discharge its stored charge onto the digit line 310 thereby biasing the digit line 310 to a voltage associated with the stored logic state.

After the cell dump phase, a sense phase may begin. During the sense phase, the charge transfer device 320 may selectively transfer the charge on the digit line 310 (e.g., resulting from the cell dump phase) to the node 340 based on the state of the memory cell 305 and/or the gate voltage applied to the gate of the charge transfer device 320. The sense component 315 may be configured to sense a signal on the node 340 after the charge is transferred (or not transferred). Example of such an operation is detailed below.

During the sense phase, a first voltage may be applied to the gate of the charge transfer device 320 after the memory cell 305 has dumped the charge onto the digit line 310. If the voltage on the digit line 310 is less than the first voltage, the charge transfer device 320 may transfer the charge between the digit line 310 and the node 340. If the voltage on the digit line is greater than the first voltage, the charge transfer may not transfer the charge. The sense component 315 may be activated (e.g., strobed) to determine the charge on the node 340 and/or whether the charge was transferred using the first voltage. A second voltage may be applied to the gate of the charge transfer device 320 after the first voltage has been applied. Again, the sense component 315 may be activated (e.g., strobed) to determine the charge on the node 340 and/or whether the charge was transferred based on using the second voltage. In some cases, this process may repeat until a number of (e.g., all of) the set of gate voltages are applied to the gate of the charge transfer device 320. In some cases, this process may repeat until the transfer of charge is detected. At which time, additional sense operations may cease or be abbreviated. In some cases, the sensing operations may continue up to a predetermined number times based on a number of logic states that the memory cell 305 is configured to store.

During a read operation the first voltage may be based in part on a logic value that the memory cell 305 may store. For example, if the memory cell 305 is configured to store four logic states (e.g., "00", "01", "10", and "11") then the first voltage may be associated with logic states "00" and "01". In some examples, the first voltage may also account for the threshold voltage (e.g., $V_t$) of the charge transfer device 320. By accounting for the threshold voltage of the charge transfer device 320, the charge transfer device may remain activated (e.g., in an "on" position) when the first voltage is maintained on the gate.

In some examples, a compensation device 325 may be implemented in order to bias the gate of the charge transfer device 320 to a first voltage. A memory device may include multiple charge transfer devices (e.g., for multiple digit lines). Because each charge transfer device may have a unique threshold voltage (e.g., a unique $V_t$), having at least one compensation device 325 for each charge transfer device may account for the unique threshold voltage. Thus by using a compensation device 325 to set the gate voltage of the charge transfer device 320, the uniformity of a read operation across the memory device may be improved even though threshold voltages may vary. In some examples, during the compensation phase, the node 340 may be precharged (e.g., to $V_{cc}$) by activating transistor 330 and applying a voltage from voltage source 355 to the node 340.

When conducting a read operation on memory cell 305, the memory cell 305 may be discharged onto the digit line 310. Multiple voltages may be applied to the gate of the charge transfer device 320. The sense component 315 may be strobed multiple times during a single read operation. Stated another way, sense component 315 may sense a voltage of the node 340 multiple times in order to determine a logic state of the memory cell 305. To conduct a first sense operation (e.g., a first strobe), the memory cell 305 may be discharged onto the digit line 310. Accordingly, by discharging the memory cell 305, the digit line 310 may be biased to a voltage, which may be based on a logic state stored to the memory cell 305. For example, the digit line 310 may be biased to a different voltage if the memory cell 305 were to store a logic "1" state, than if the memory cell 305 were to store a logic "0" state.

The charge transfer device 320 may selectively transfer the charge on the digit line 310 to the node 340 under certain conditions. Due to the charge transfer device 320 being activated (e.g., due to the first voltage applied to the gate), the charge from the memory cell 305 may be transferred to the node 340 if the resulting voltage is less than the first voltage (e.g., of the gate of the charge transfer device 320). Because the charge across the digit line 310 and the resulting voltage applied to the gate of the charge transfer device 320 may be associated with a logic state of the memory cell 305, the charge transfer device 320 may activate based on a particular logic state being stored to the memory cell 305. In some cases, the charge transfer device 320 may activate to varying degrees based on the gate voltage (e.g., the first voltage) and the voltage applied to the source of the charge transfer device 320 (e.g., the voltage on the digit line that is based on the logic state stored in the memory cell 305).

Accordingly, the resulting voltage of the node 340 is dependent on whether the charge transfer device 320 is activated. Stated another way, if the voltage of the digit line 310 is less than the first voltage, the charge is transferred between the digit line 310 and the node 340, and the resulting voltage is sensed by the sense component 315. If the charge transfer device 320 is deactivated (e.g., the voltage of the digit line 310 exceeds the first voltage applied to the gate), the voltage of the node 340 may remain at or near the precharge voltage (e.g., $V_{cc}$) applied by the voltage source 355.

The read operation may continue after sensing the voltage of the node 340 (e.g., strobing the sense component 315) at a first time. In some examples if, after sensing the node 340 at a first time, the gate of the charge transfer device 320 may be biased to a second voltage. After the second voltage is applied, the sense component 315 may be strobed a second time. The first voltage may be based in part on first and second logic values that the memory cell 305 may store. Accordingly, the second voltage may be associated with the second and third logic values that the memory cell 305 may store—e.g., logic states "01" and "10". In some examples, the second voltage may also account for the threshold voltage (e.g., $V_t$) of the charge transfer device 320. By accounting for the threshold voltage of the charge transfer device 320, the charge transfer device may be activated when the second voltage is maintained on the gate.

When conducting a subsequent sense operation on memory cell 305, the node 340 may be sensed, for a second time, after the second voltage is applied to the gate of the charge transfer device 320. The charge transfer device 320 may transfer the existing charge on the digit line 310 to the node 340 under certain conditions. If the charge transfer device 320 remains activated (e.g., the voltage of the digit line 310 is less than the second voltage), the charge on the digit line 310 may be transferred to the node 340, and the resulting voltage may be sensed by the sense component 315. If the charge transfer device 320 is deactivated (e.g., the voltage of the digit line 310 exceeds the second voltage), the voltage of the node 340 may remain at or near the precharge voltage (e.g., $V_{cc}$) applied by the voltage source 355. In either example, the voltage of the node 340 may be sensed by the sense component 315 for a second time.

As described above, the number of strobes (e.g., the number of sense operations) during a read operation may be represented by n−1, where n is the number of logic states that the memory cell 305 is configured to store. So if memory cell 305 was configured to store three logic states (e.g., logic "00", "mid", and "11"), then the sense component 315 may be configured to determine a logic state of the memory cell 305 using up to two sense operations during a same read operation. For example, during the compensation phase, the node 340 is precharged to a precharge voltage (e.g., $V_{cc}$). The sense component 315 may latch the precharge voltage, which may be or may be understood to be a logic "1" value.

In some examples, the read operation may continue after sensing the voltage of the node 340 for the second time. Stated another way, the memory cell 305 may be configured to store four logic states. In some examples, the gate of the charge transfer device 320 may be biased to a third voltage. When conducting a subsequent sense operation on memory cell 305, the node 340 may be sensed, for a third time, after the third voltage is applied to the gate of the charge transfer device 320. The charge transfer device 320 may transfer the charge on the digit line 310 to the node 340 if the charge transfer device 320 remains activated (e.g., the voltage of the digit line 310 is less than the third voltage).

In some examples, the sense component 315 may sense the signal at node 340 using a fixed reference value at different times (e.g., at a first time, at a second time, etc.). Stated another way, the sense component 315 may utilize a same, fixed, reference voltage every time that the voltage of the node 340 is sensed. Thus the sense component 315 may conduct a sense operation by comparing the signal of the node 340 to the fixed reference voltage value after each time that the memory cell 305 is discharged.

In some examples, the sense component 315 may be coupled with a write logic block (not shown). In some examples, the write logic block may be configured to write a logic value to the memory cell based on a read operation. As described above, a read operation may include multiple sense operations (e.g., multiple strobes) on a memory cell configured to store either three logic states or four logic states. Thus, the determined logic value of memory cell 305, using any of the aforementioned methods, may be written back to memory cell 305 using the write logic block.

Figure 4:
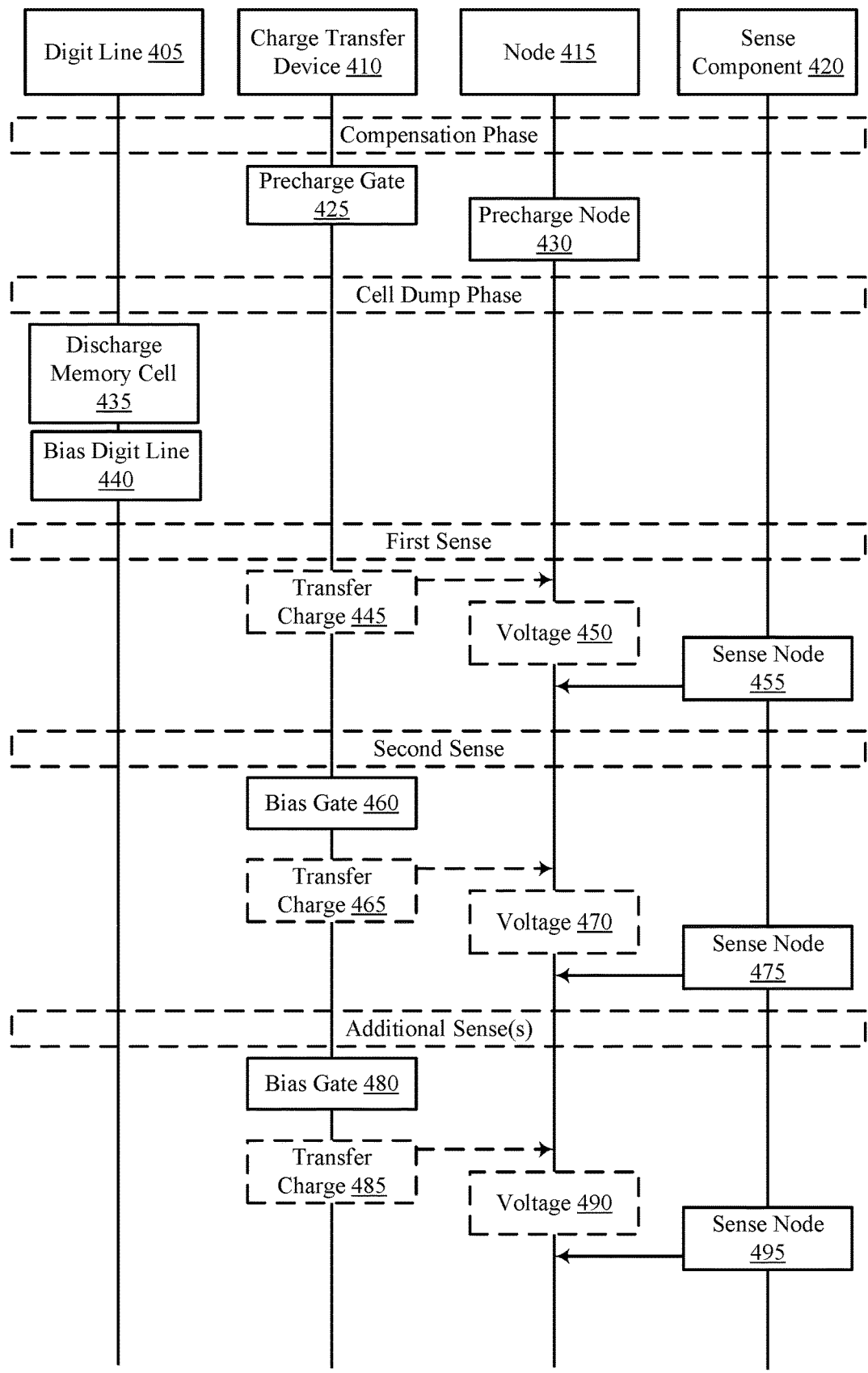
FIG. 4 illustrates an example flow diagram that supports sensing techniques for multi-level cells in accordance with aspects of the present disclosure.

FIG. 4 illustrates an example of a flow diagram 400 that supports sensing techniques for multi-level cells in accordance with aspects of the present disclosure. In some examples, the flow diagram 400 illustrates what occurs at one or more components described above with reference to FIGS. 1 through 3. The functions and actions that occur at the various components discussed in the flow diagram 400 may be initiated by a controller (e.g., external memory controller 105, device memory controller 155, local memory controller 165, local memory controller 260 as described with reference to FIGS. 1 and 2). For example, flow diagram 400 may include a digit line 405, which may be an example of digit line 310 as described with reference to FIG. 3; a charge transfer device 410, which may be an example of charge transfer device 320 as described with reference to FIG. 3; a node 415, which may be an example of a node 340 as described with reference to FIG. 3; and a sense component 420, which may be an example of a sense component 315 as described with reference to FIG. 3.

In some examples, flow diagram 400 may illustrate a read operation of a multi-level memory cell (e.g., memory cell 305 as described with reference to FIG. 3). The memory cell may be configured to store three or more logic states. One or more of the operations depicted by flow diagram 400 may be optional. For example, the sense component 420 may be configured to conduct three sense operations (e.g., during a single read operation) on a memory cell configured to store four logic states. However, in some examples, if the memory cell were to store a "low" logic state (e.g., a logic "00") only one sense operation (e.g., only one strobe) may be necessary to determine the logic state.

In some examples, a compensation phase may be used to bias the gate of the charge transfer device to a first voltage and the digit line to a second voltage. A difference between the first voltage and the second voltage may compensate for the threshold voltage of the charge transfer device. In some examples, the gate of the charge transfer device may be biased to $V_{read}$ and the digit line may be biased to $V_{read}$ minus the threshold voltage (e.g., $V_t$) of the charge transfer device (e.g., $V_{read}$-$V_t$). In some examples, the gate of the charge transfer device may be biased to a voltage that is a precharge voltage (e.g., Dvc2) of the digit line and the threshold voltage (e.g., $V_t$) of the gate charge transfer device (e.g., Dvc2+$V_t$).

At 425 the gate of the charge transfer device 410 may be precharged to a first voltage. As described above with reference to FIG. 3, the first voltage may be selected based on two potential logic states of the memory cell. For example, the first voltage may be between a voltage associated with a lowest logic level the memory cell is configured to store (e.g., a logic "00") and a logic "mid" for three-level memory cell, and a logic "00" and a logic "01" for a four-level memory cell. The first voltage may be selected to be between the two lowest potential logic states of the memory cell such that, if the charge transfer device 410 transfers a charge associated with the memory cell after a first discharge operation (e.g., a first biasing of the digit line 405), the sense component 420 may determine that the logic state of the memory cell is at the lowest logic level the memory cell is configured to store. Conversely, if the charge transfer device does not transfer a charge associated with the memory cell after a first discharge operation, the sense component 420 may determine that the logic state of the memory cell is at least at the second lowest logic level the memory cell is configured to store.

In some examples, to precharge the gate of the charge transfer device 410, a first voltage from a voltage source (e.g., $V_{read}$) may be applied to the gate of the charge transfer device 410 and a second voltage from a second voltage source (e.g., $V_{cceq}$) may be applied to the gate of a compensation device (e.g., compensation device 325 as described with reference to FIG. 3). By applying the voltage to the gate of the charge transfer device 410, the resulting gate voltage may be approximately 0.85V. By applying the voltage to the gate of the compensation device, the resulting gate voltage may be approximately 1.8V.

At 430 the node 415 may be precharged to a precharge voltage level. The precharge voltage level may be a known voltage level (e.g., $V_{cc}$). For example if, after a first discharge operation, the sense component 420 senses the voltage of the node 415 to be at the precharge voltage level, the gate of the charge transfer device 410 may be altered to a second voltage value and a second discharge operation may occur. Stated another way, the precharge voltage value may indicate to the memory device (e.g., to a memory controller) whether a subsequent sense operation (e.g., during the same read operation) is necessary. In some examples, biasing the gate of the charge transfer device 410 and precharging the node 415 may be referred to as a compensation phase of the read operation. Alternatively, for example, only biasing the gate of the charge transfer device 410 may be considered to be part of the compensation phase.

In some examples, after precharging the gate of the charge transfer device 410 and the node 415, the node 415 may be biased to the first voltage (e.g., $V_{read}$) and the resulting voltage of the digit line 405 may be a difference between the voltage on the gate of the charge transfer device 410 and a threshold voltage (e.g., $V_t$) of the charge transfer device 410 (e.g., $V_{read}$-$V_t$).

A cell dump phase may begin after the compensation phase. During a cell dump phase, a memory cell (e.g., memory cell 305 as described with reference to FIG. 3) may be discharged onto the digit line 405. Discharging the memory cell may bias the digit line (e.g., to a value associated with the logic state of the memory cell). In some examples, the resulting charge on the digit line 405 may be transferred to the node 415 during a sense operation.

At 435 the memory cell may be discharged onto the digit line 405. To discharge the memory cell, a switching component (e.g., transistor 360 as described with reference to FIG. 3) may be activated and a capacitor (e.g., capacitor 365 as described with reference to FIG. 3) may be discharged. At 440 the digit line 405 may be biased to a voltage associated with a logic state of the memory cell. Stated another way, due to the memory cell may being discharged onto the digit line, the digit line may have a voltage that represents a logic state stored to the memory cell. For example, if the memory cell is configured to store four logic states (e.g., logic "00", "01", "10" and "11") the voltage may be representative of one of the four logic states. In some examples, the voltage may be applied to the source of the charge transfer device 410. In some examples, discharging the memory cell and biasing the digit line 405 may be referred to as a cell dump phase of the read operation.

A sense operation may include the charge transfer device 410 transferring (or not transferring) a charge from the digit line 405 to the node 415 and a sense component being activated at least once. A sense operation may also include biasing or re-biasing the gate of the charge transfer device to a voltage. In some examples, whether the charge is transferred may be due to the voltage on the digit line 405 being less than the voltage applied to the gate of the charge transfer device 410.

At 445, the charge transfer device 410 may optionally transfer a charge of the digit line 405 to the node 415. For example, because a first voltage was applied to the gate of the charge transfer device 410, the charge transfer device 410 may transfer the charge if the voltage applied to the source is less than the voltage applied to the gate. Thus, if the charge transfer device 410 transfers the charge on the digit line to the node 415, the voltage of the node 415 (e.g., at 450) may transition to a lower voltage value (e.g., the voltage of the node may be reduced). As discussed above, the voltage of the digit line may be associated with the logic state of the memory cell. If the charge is transferred with the node 415, the voltage of the node (e.g., at 450) may represent a logic "0" state of the memory cell. Conversely, if the charge transfer device 410 does not transfer the charge on the digit line to the node 415, the voltage of the node 415 may remain at the precharge voltage value. If the charge is not transferred, it may indicate that the voltage on the digit line 405 is greater than the voltage applied to the gate of the charge transfer device 410.

As discussed above, at 450, the voltage of the node 415 may represent a charge transferred (e.g., from the memory cell) to the node 415 via the charge transfer device 410, or the precharge value of the node 415 based on whether the charge transfer device was activated. At 455 the node 415 may subsequently be sensed. Because the precharged value of the node (e.g., at 430) may represent a logic "1" value, the logic state of the memory cell may be determined based on sensing the voltage at the node 415. Stated another way, the logic state of the memory cell may be known if the voltage on the node 415 represents a logic "0" value.

For example, the sense component 420 may have previously latched a logic "1" value. If the voltage on the gate was set between a logic "low" and a logic "mid" (e.g., for a memory cell configured to store three logic states), or between a logic "00" and a logic "01" (e.g., for a memory cell configured to store four logic states), transferring the charge to the node 415 (e.g., via charge transfer device 410) indicates that the logic state of the memory cell is either a logic "low" or a logic "00" (e.g., depending on the configuration of the memory cell). Conversely, if the voltage on the node 415 represents a logic "1" then an additional sense operation may be necessary to determine the logic state stored to the memory cell. In some examples, the operations discussed at 445, 450, and 455 may be referred to as a first sense phase of a read operation.

In some examples, various schemes may be implemented to determine a logic state of the memory cell. For example, a memory controller (e.g., local memory controller 260 as described with reference to FIG. 2) may sense the voltage of the node (e.g., at 455) during the first sense operation. If the voltage of the node remains at the precharge voltage value, the gate of the charge transfer device 410 may be biased (e.g., to a second voltage value) at 460. In another example, the memory controller may conduct multiple sense operations (e.g., based on a number of logic states that the memory cell is configured to store) and may determine a logic state of the memory controller after the sense operations are conducted. In such an example, the memory controller may utilize a timing mechanism to determine the logic state of the memory cell. For example, if the memory controller senses a change in the voltage of the node 415 after a first time, the memory cell may store a different logic value than if the memory controller senses a change in the voltage of the node 415 after a second time (e.g., a different time).

As described above with reference to FIG. 3, the second voltage may be selected based on two potential logic states of the memory cell. For example, the second voltage may reside between a voltage associated with the "mid" logic level that the memory cell is configured to store (e.g., a logic "01") and the highest logic level the memory cell is configured to store (e.g., a logic "11") for three-level memory cell, and a logic "01" and a logic "10" for a four-level memory cell. The second voltage may be selected to reside between these logic states of the memory cell such that, if the charge transfer device 410 transfers a charge associated with the memory cell after a second discharge operation, the sense component 420 may determine that the logic state of the memory cell is at the lowest logic level the memory cell is configured to store. Conversely, if the charge transfer device does not transfer a charge associated with the memory cell after a second discharge operation, the sense component 420 may determine that the logic state of the memory cell is at least at the second lowest logic level the memory cell is configured to store.

At 465, the charge transfer device 410 may transfer a charge of the digit line 405 to the node 415. Stated another way, because the gate of the charge transfer device 410 was precharged (e.g., a first voltage was applied to the gate of the charge transfer device 410), the charge transfer device 410 may transfer the charge if the voltage applied to the source is less than the voltage applied to the gate. At 470, the voltage of the node 415 may represent a charge transferred (e.g., from the memory cell) to the node 415 via the charge transfer device 410, or the precharge value of the node 415. At 475 the node 415 may subsequently be sensed. As discussed above, if the voltage value on the node 415 represents a logic "0" then the logic state of the memory cell may be determined. Conversely, if the voltage value on the node 415 represents a logic "1" (e.g., the precharge voltage) then an additional sense operation may be necessary to determine the logic state stored to the memory cell. In some examples, the operations discussed at 460, 465, 470, and 475 may be referred to as a second sense phase of a read operation.

If after the second sense phase the logic state of the memory cell is unknown, the gate of the charge transfer device 410 may be biased (e.g., to a third voltage value) at 480. As described above with reference to FIG. 3, the third voltage may be selected based on two potential logic states of the memory cell that is configured to store four states. For example, the third voltage may reside between a logic "10" and a logic "11".

At 485, the charge transfer device 410 may transfer a charge of the digit line 405 to the node 415. Stated another way, because the gate of the charge transfer device 410 was precharged (e.g., a first voltage was applied to the gate of the charge transfer device 410), the charge transfer device 410 may transfer the charge if the voltage applied to the source is less than the voltage applied to the gate. At 490, the voltage of the node 415 may represent a charge transferred (e.g., from the memory cell) to the node 415 via the charge transfer device 410, or the precharge value of the node 415. At 495 the node 415 may subsequently be sensed. In a memory cell configured to store four logic states, sensing the node for a third time may determine the logic state of the memory cell. Stated another way, if a memory cell that is configured to store four logic states is sensed three times, the memory cell may store a logic "11" value. In some examples, the operations discussed at 480, 485, 490, and 495 may be referred to as a third sense phase of a read operation. In some examples, additional sense operations may occur (e.g., if the memory cell is configured to store more than four logic states).

Figure 5:
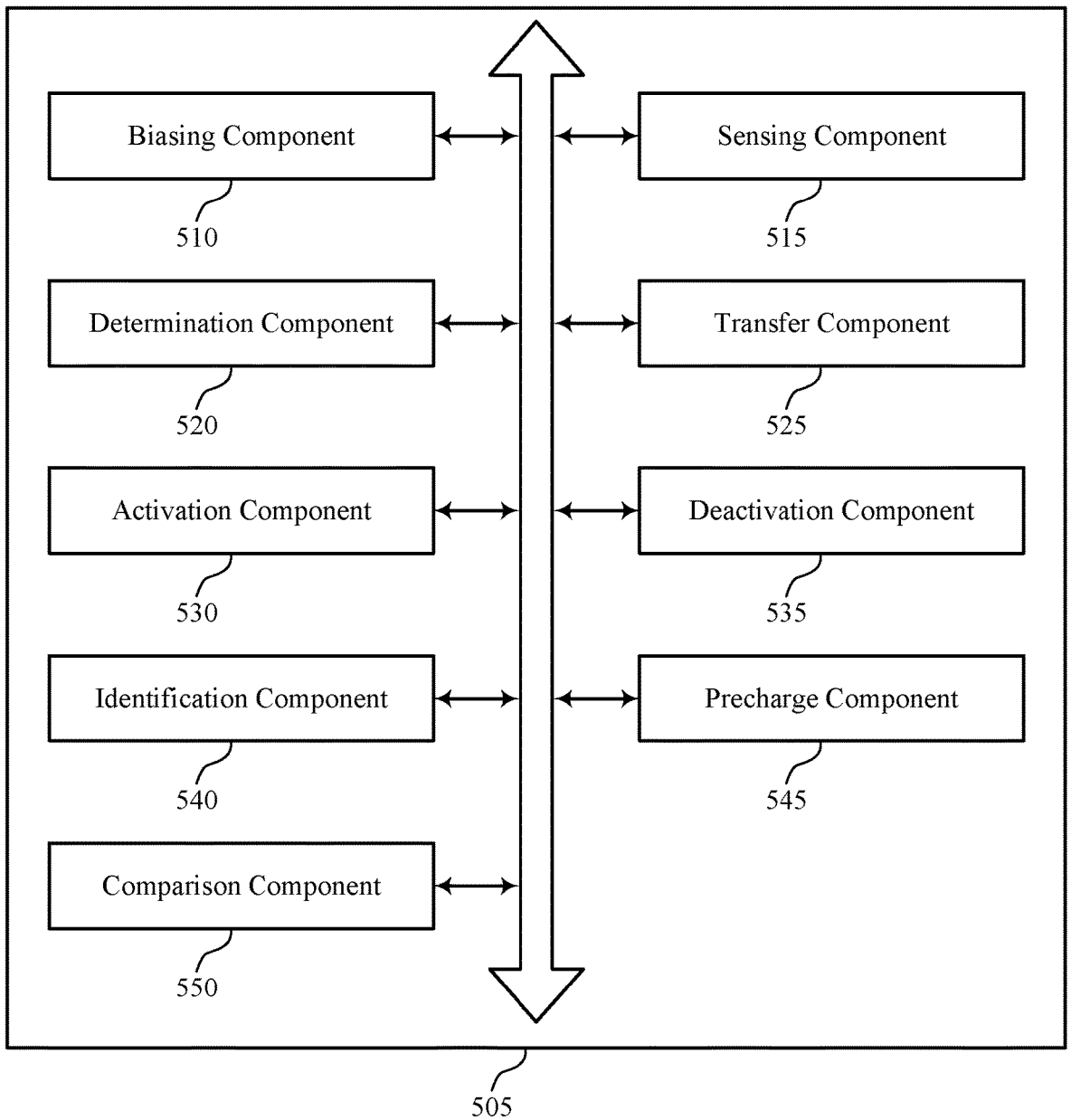
FIG. 5 illustrates a block diagram of a device that supports sensing techniques for multi-level cells in accordance with aspects of the present disclosure.

FIG. 5 shows a block diagram 500 of a memory controller 505 that supports sensing techniques for multi-level cells in accordance with aspects of the present disclosure. The memory controller 505 may be an example of aspects of a memory controller (e.g., external memory controller 105 as described with reference to FIG. 1) The memory controller 505 may include biasing component 510, sensing component 515, determination component 520, transfer component 525, activation component 530, deactivation component 535, identification component 540, precharge component 545, and comparison component 550. Each of these components may communicate, directly or indirectly, with one another (e.g., via one or more buses).

Biasing component 510 may bias a gate of a transistor to a first voltage during a read operation. The transistor may be coupled with a digit line and a node of a sense component. In some examples, biasing component 510 may bias the gate of the transistor to a second voltage based at least in part on sensing the precharge voltage on the node. Biasing component 510 may bias the digit line to a fourth voltage by discharging the multi-level memory cell onto the digit line. In some examples, biasing component 510 may bias a gate of a transistor to a plurality of gate voltages during a read operation. Biasing component 510 may bias the digit line to a first voltage by discharging the multi-level memory cell onto the digit line before biasing the gate of the transistor to the plurality of gate voltages.

Sensing component 515 may sense a precharge voltage on the node based at least in part on biasing the gate of the transistor to the first voltage. In some examples, sensing component 515 may sense a third voltage on the node when the gate of the transistor is biased to the second voltage. The third voltage being different than the precharge voltage. Sensing component 515 may sense a voltage on the node at a plurality of times during the read operation. In some examples, the voltage on the node is sensed at least one time for each gate voltage applied to the gate of the transistor.

Determination component 520 may determine a logic state of a multi-level memory cell coupled with the digit line based at least in part on sensing the third voltage. Determination component 520 may determine a logic state of a multi-level memory cell coupled with the digit line based at least in part on sensing the voltage on the node at each of the plurality of times during the read operation.

Transfer component 525 may transfer, using the transistor, a charge to the node based at least in part on the fourth voltage being less than the second voltage on the gate of the transistor. In some examples, transfer component 525 may transfer, using the transistor, a charge between the digit line and the node based at least in part on the first voltage being less than a first gate voltage of the plurality of gate voltages of the gate of the transistor.

Activation component 530 may activate a second transistor coupled with the gate of the transistor. In some examples, biasing the gate of the transistor to the second voltage is based at least in part on activating the second transistor.

Deactivation component 535 may deactivate the second transistor after biasing the gate of the transistor to the second voltage. In some examples, the second transistor is configured to compensate for a threshold voltage associated with the transistor.

Identification component 540 may identify when the third voltage is sensed during the read operation. In some examples, determining the logic state of the multi-level memory cell may be based at least in part on when the third voltage is sensed during the read operation.

Precharge component 545 may precharge, using a voltage source coupled with the node, the node to the precharge voltage before biasing the gate of the transistor to the first voltage.

Comparison component 550 may compare the third voltage sensed on the node to a fixed reference voltage. In some examples, determining the logic state of the multi-level memory cell may be based at least in part on the comparison.

Figure 6:
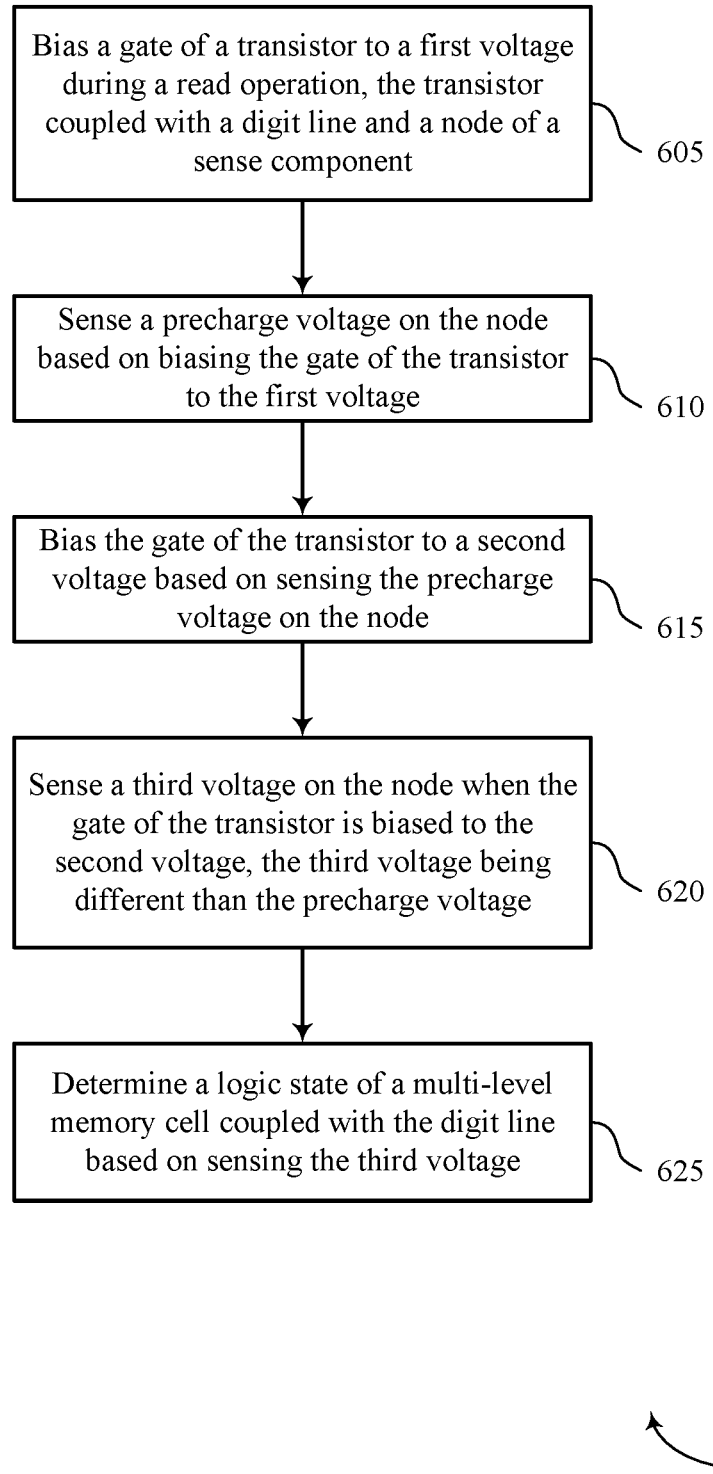
FIGS. 6 through 9 show flowcharts illustrating a method or methods that support sensing techniques for multi-level cells in accordance with aspects of the present disclosure.

FIG. 6 shows a flowchart illustrating a method 600 that supports sensing techniques for multi-level cells in accordance with aspects of the present disclosure. The operations of method 600 may be implemented by a memory controller or its components as described herein. For example, the operations of method 600 may be performed by a memory controller as described with reference to FIGS. 1 through 5. In some examples, a memory controller may execute a set of instructions to control the functional elements of the memory array to perform the functions described below. Additionally or alternatively, a memory array may perform aspects of the functions described below using special-purpose hardware.

At 605, a gate of a transistor may be biased to a first voltage during a read operation. In some examples, a transistor may be coupled with a digit line and a node of a sense component. The operations of 605 may be performed according to the methods described herein. In some examples, aspects of the operations of 605 may be performed by a biasing component as described with reference to FIG. 5.

At 610, a precharge voltage on the node may be sensed based on biasing the gate of the transistor to the first voltage. The operations of 610 may be performed according to the methods described herein. In some examples, aspects of the operations of 610 may be performed by a sensing component as described with reference to FIG. 5.

At 615, the gate of the transistor may be biased to a second voltage based on sensing the precharge voltage on the node. The operations of 615 may be performed according to the methods described herein. In some examples, aspects of the operations of 615 may be performed by a biasing component as described with reference to FIG. 5.

At 620, a third voltage on the node may be sensed when the gate of the transistor is biased to the second voltage. The third voltage may be different than the precharge voltage. The operations of 620 may be performed according to the methods described herein. In some examples, aspects of the operations of 620 may be performed by a sensing component as described with reference to FIG. 5.

At 625, a logic state of a multi-level memory cell coupled with the digit line may be determined based on sensing the third voltage. The operations of 625 may be performed according to the methods described herein. In some examples, aspects of the operations of 625 may be performed by a determination component as described with reference to FIG. 5.

Figure 7:
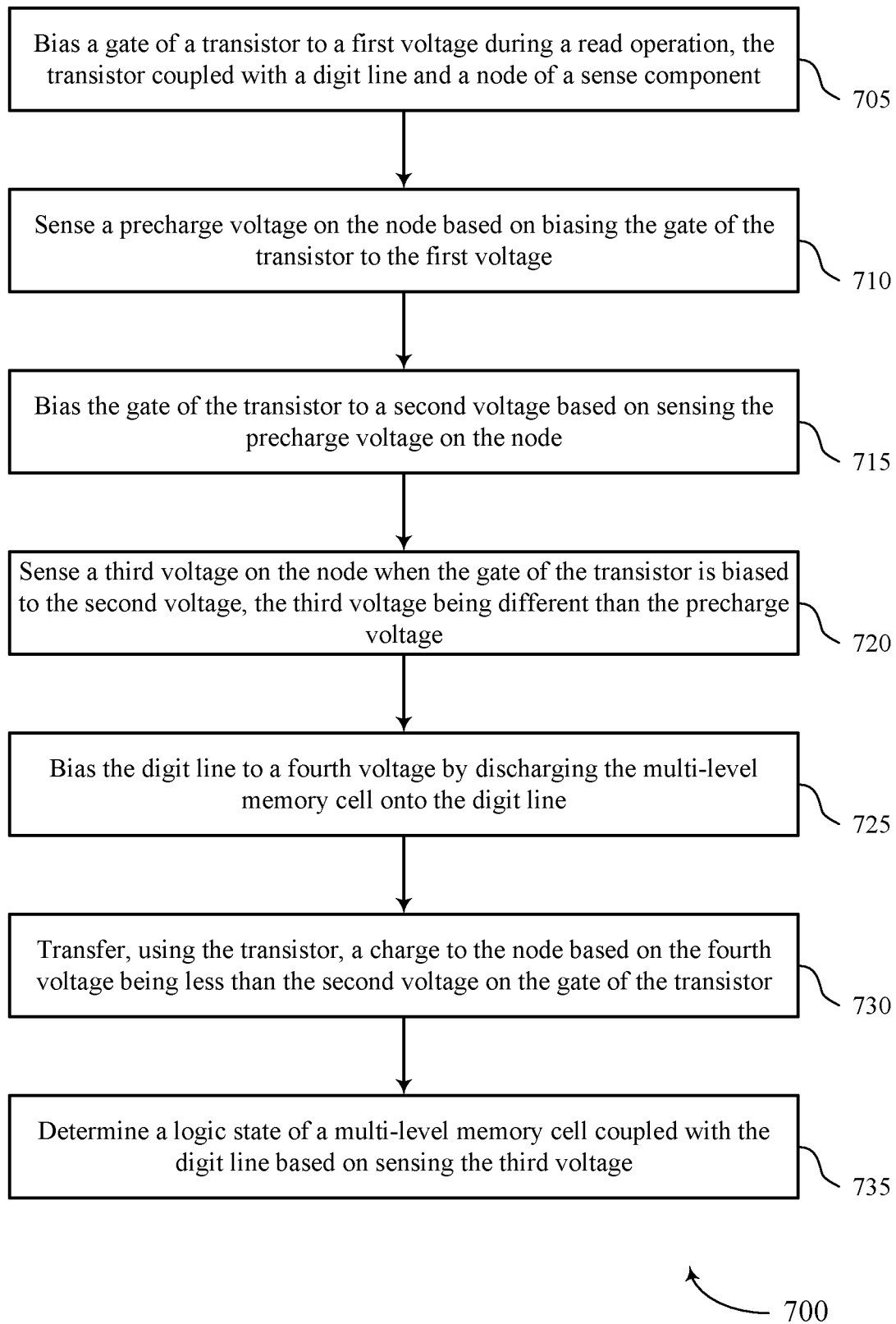

FIG. 7 shows a flowchart illustrating a method 700 that supports sensing techniques for multi-level cells in accordance with aspects of the present disclosure. The operations of method 700 may be implemented by a memory controller or its components as described herein. For example, the operations of method 700 may be performed by a memory controller as described with reference to FIGS. 1 through 5.

In some examples, a memory controller may execute a set of instructions to control the functional elements of the memory array to perform the functions described below. Additionally or alternatively, a memory array may perform aspects of the functions described below using special-purpose hardware.

At 705, a gate of a transistor may be biased to a first voltage during a read operation. In some examples, a transistor may be coupled with a digit line and a node of a sense component. The operations of 705 may be performed according to the methods described herein. In some examples, aspects of the operations of 705 may be performed by a biasing component as described with reference to FIG. 5.

At 710, a precharge voltage on the node may be sensed based on biasing the gate of the transistor to the first voltage. The operations of 710 may be performed according to the methods described herein. In some examples, aspects of the operations of 710 may be performed by a sensing component as described with reference to FIG. 5.

At 715, the gate of the transistor may be biased to a second voltage based on sensing the precharge voltage on the node. The operations of 715 may be performed according to the methods described herein. In some examples, aspects of the operations of 715 may be performed by a biasing component as described with reference to FIG. 5.

At 720, a third voltage on the node may be sensed when the gate of the transistor is biased to the second voltage. The third voltage may be different than the precharge voltage. The operations of 720 may be performed according to the methods described herein. In some examples, aspects of the operations of 720 may be performed by a sensing component as described with reference to FIG. 5.

At 725, the digit line may be biased to a fourth voltage by discharging the multi-level memory cell onto the digit line. The operations of 725 may be performed according to the methods described herein. In some examples, aspects of the operations of 725 may be performed by a biasing component as described with reference to FIG. 5.

At 730, a charge may be transferred, using the transistor, to the node based on the fourth voltage being less than the second voltage on the gate of the transistor. The operations of 730 may be performed according to the methods described herein. In some examples, aspects of the operations of 730 may be performed by a transfer component as described with reference to FIG. 5.

At 735, a logic state of a multi-level memory cell coupled with the digit line may be determined based on sensing the third voltage. The operations of 735 may be performed according to the methods described herein. In some examples, aspects of the operations of 735 may be performed by a determination component as described with reference to FIG. 5.

Figure 8:
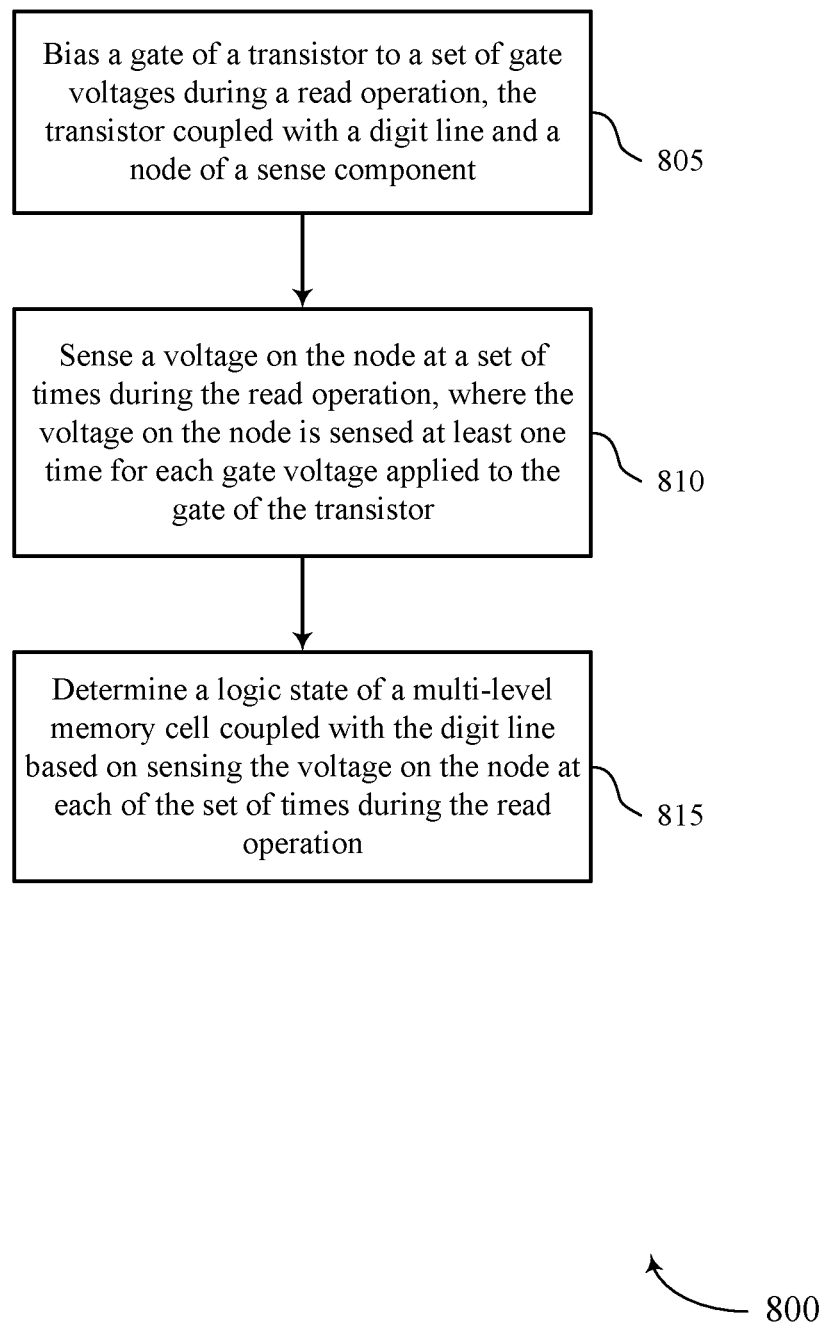

FIG. 8 shows a flowchart illustrating a method 800 that supports sensing techniques for multi-level cells in accordance with aspects of the present disclosure. The operations of method 800 may be implemented by a memory controller or its components as described herein. For example, the operations of method 800 may be performed by a memory controller as described with reference to FIGS. 1 through 5. In some examples, a memory controller may execute a set of instructions to control the functional elements of the memory array to perform the functions described below. Additionally or alternatively, a memory array may perform aspects of the functions described below using special-purpose hardware.

At 805, a gate of a transistor may be biased to a set of gate voltages during a read operation. The transistor may be coupled with a digit line and a node of a sense component. The operations of 805 may be performed according to the methods described herein. In some examples, aspects of the operations of 805 may be performed by a biasing component as described with reference to FIG. 5.

At 810, a voltage on the node may be sensed at a set of times during the read operation. The voltage on the node may be sensed at least one time for each gate voltage applied to the gate of the transistor. The operations of 810 may be performed according to the methods described herein. In some examples, aspects of the operations of 810 may be performed by a sensing component as described with reference to FIG. 5.

At 815, a logic state of the multi-level memory cell coupled with the digit line may be determined based on sensing the voltage on the node at each of the set of times during the read operation. The operations of 815 may be performed according to the methods described herein. In some examples, aspects of the operations of 815 may be performed by a determination component as described with reference to FIG. 5.

Figure 9:
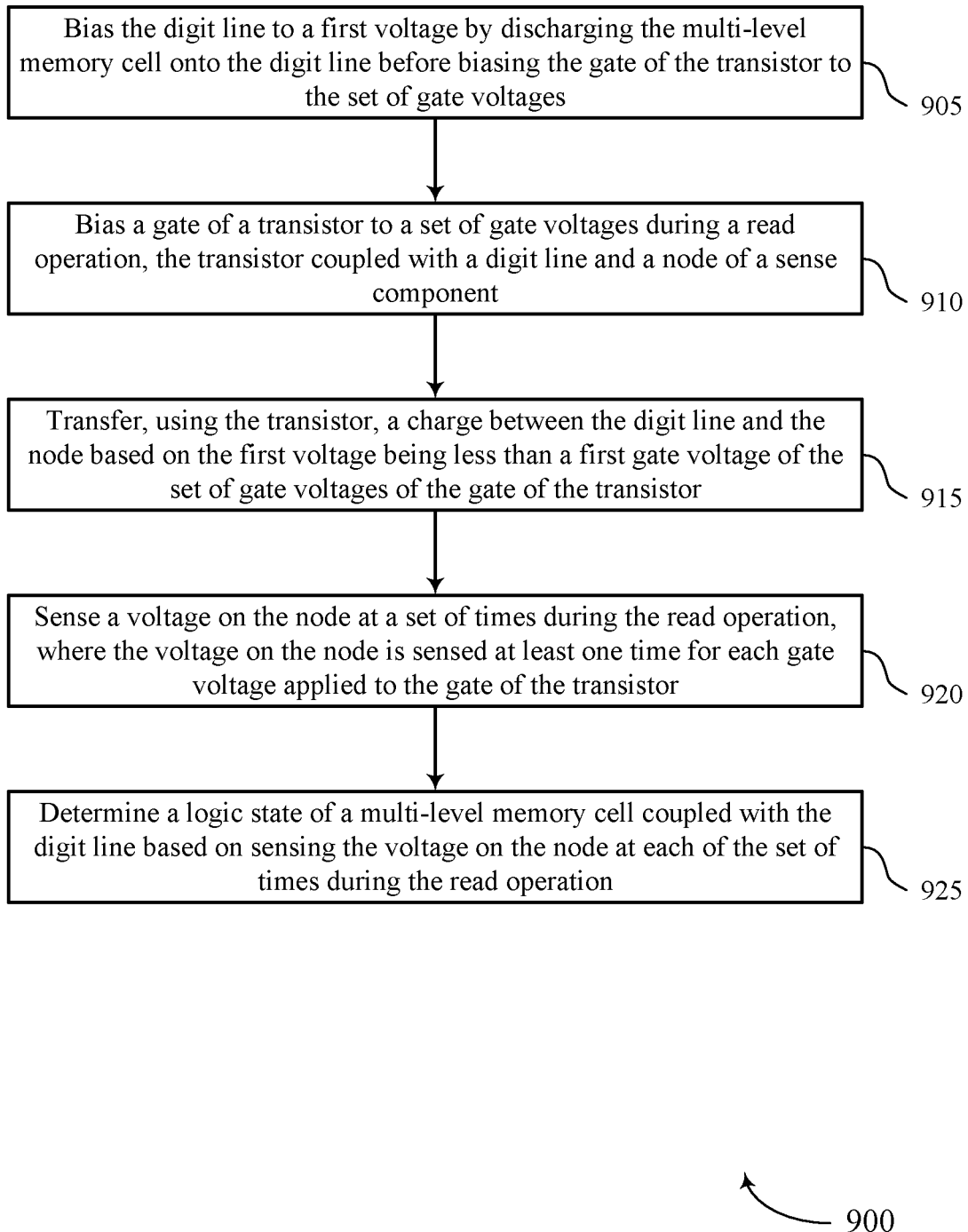

FIG. 9 shows a flowchart illustrating a method 900 that supports sensing techniques for multi-level cells in accordance with aspects of the present disclosure. The operations of method 900 may be implemented by a memory controller or its components as described herein. For example, the operations of method 900 may be performed by a memory controller as described with reference to FIGS. 1 through 5. In some examples, a memory controller may execute a set of instructions to control the functional elements of the memory array to perform the functions described below. Additionally or alternatively, a memory array may perform aspects of the functions described below using special-purpose hardware.

At 905, a digit line may be biased to a first voltage by discharging a multi-level memory cell onto the digit line before biasing the gate of the transistor to a set of gate voltages. The operations of 905 may be performed according to the methods described herein. In some examples, aspects of the operations of 905 may be performed by a biasing component as described with reference to FIG. 5.

At 910, a gate of a transistor may be biased to a set of gate voltages during a read operation. The transistor may be coupled with the digit line and the node of the sense component. The operations of 805 may be performed according to the methods described herein. In some examples, aspects of the operations of 805 may be performed by a biasing component as described with reference to FIG. 5.

At 915, a charge may be transferred, using the transistor, between the digit line and the node based on the first voltage being less than a first gate voltage of the set of gate voltages of the gate of the transistor. The operations of 915 may be performed according to the methods described herein. In some examples, aspects of the operations of 915 may be performed by a transfer component as described with reference to FIG. 5.

At 920, a voltage on the node may be sensed at a set of times during the read operation. The voltage on the node may be sensed at least one time for each gate voltage applied to the gate of the transistor. The operations of 920 may be performed according to the methods described herein. In some examples, aspects of the operations of 920 may be performed by a sensing component as described with reference to FIG. 5.

At 925, a logic state of the multi-level memory cell coupled with the digit line may be determined based on sensing the voltage on the node at each of the set of times during the read operation. The operations of 925 may be performed according to the methods described herein. In some examples, aspects of the operations of 925 may be performed by a determination component as described with reference to FIG. 5.

A method is described. In some examples, the method may include biasing a gate of a transistor to a first voltage during a read operation, the transistor coupled with a digit line and a node of a sense component, sensing a precharge voltage on the node based at least in part on biasing the gate of the transistor to the first voltage, biasing the gate of the transistor to a second voltage based at least in part on sensing the precharge voltage on the node, sensing a third voltage on the node when the gate of the transistor is biased to the second voltage, the third voltage being different than the precharge voltage, and determining a logic state of a multi-level memory cell coupled with the digit line based at least in part on sensing the third voltage.

The method may include biasing the digit line to a fourth voltage by discharging the multi-level memory cell onto the digit line and transferring, using the transistor, a charge to the node based at least in part on the fourth voltage being less than the second voltage on the gate of the transistor. In some examples, the method may include activating a second transistor coupled with the gate of the transistor, wherein biasing the gate of the transistor to the second voltage is based at least in part on activating the second transistor. The method may include deactivating the second transistor after biasing the gate of the transistor to the second voltage, wherein the second transistor is configured to compensate for a threshold voltage associated with the transistor.

The method may include identifying when the third voltage is sensed during the read operation, wherein determining the logic state of the multi-level memory cell is based at least in part on when the third voltage is sensed during the read operation. In some examples, the method may include precharging, using a voltage source coupled with the node, the node to the precharge voltage before biasing the gate of the transistor to the first voltage. In some examples, the method may include comparing the third voltage sensed on the node to a fixed reference voltage, wherein determining the logic state of the multi-level memory cell is based at least in part on the comparison.

An apparatus is described. In some examples, the apparatus may include means for biasing a gate of a transistor to a first voltage during a read operation, the transistor coupled with a digit line and a node of a sense component, means for sensing a precharge voltage on the node based at least in part on biasing the gate of the transistor to the first voltage, means for biasing the gate of the transistor to a second voltage based at least in part on sensing the precharge voltage on the node, means for sensing a third voltage on the node when the gate of the transistor is biased to the second voltage, the third voltage being different than the precharge voltage, and means for determining a logic state of a multi-level memory cell coupled with the digit line based at least in part on sensing the third voltage.

The apparatus may include means for biasing the digit line to a fourth voltage by discharging the multi-level memory cell onto the digit line and means for transferring, using the transistor, a charge to the node based at least in part on the fourth voltage being less than the second voltage on the gate of the transistor. In some examples, the apparatus may include means for activating a second transistor coupled with the gate of the transistor, wherein biasing the gate of the transistor to the second voltage is based at least in part on activating the second transistor. The apparatus may include means for deactivating the second transistor after biasing the gate of the transistor to the second voltage, wherein the second transistor is configured to compensate for a threshold voltage associated with the transistor.

In some examples, the apparatus may include means for identifying when the third voltage is sensed during the read operation, wherein determining the logic state of the multi-level memory cell is based at least in part on when the third voltage is sensed during the read operation. The apparatus may include means for precharging, using a voltage source coupled with the node, the node to the precharge voltage before biasing the gate of the transistor to the first voltage. The apparatus may include means for comparing the third voltage sensed on the node to a fixed reference voltage, wherein determining the logic state of the multi-level memory cell is based at least in part on the comparison.

An apparatus is described. In some examples, the apparatus may include a multi-level memory cell coupled with a digit line and configured to store three or more states, a sense component configured to determine a state stored on the multi-level memory cell by sensing a voltage associated with the digit line a plurality of times during a read operation, and a transistor coupled with the digit line and the sense component and configured to transfer a charge between the digit line and the sense component during the read operation of the multi-level memory cell, wherein a gate of the transistor is biased to a plurality of gate voltages during the read operation.

In some examples, a logic state of the multi-level memory cell is based at least in part on a first voltage on a gate of the transistor when a second voltage is sensed by the sense component. The apparatus may include a second transistor coupled with the gate of the transistor and configured to apply the first voltage to the gate of the transistor based on a threshold voltage associated with the transistor. In some examples, the multi-level memory cell is configured to bias the digit line to a third voltage by discharging onto the digit line, wherein the transistor is configured to transfer the charge to the sense component based at least in part on the third voltage being less than the first voltage.

In some examples, the second transistor is configured to bias the gate of the transistor to a fourth voltage based at least in part on the first voltage being less than the third voltage. In some examples, the sense component is configured to determine the logic state of the multi-level memory cell based at least in part on the transistor transferring the charge to the sense component. In some examples, a quantity of the plurality of times the voltage of the sense component is sensed during the read operation is one less than a quantity of logic states the multi-level memory cell is configured to store.

The apparatus may include a voltage source coupled with a node of the sense component, wherein the voltage source is configured to precharge the node before the read operation of the multi-level memory cell. In some examples, the transistor is configured to transfer the charge between the digit line and the sense component based at least in part on a logic state of the multi-level memory cell.

A method is described. The method may include biasing a gate of a transistor to a plurality of gate voltages during a read operation, the transistor coupled with a digit line and a node of a sense component, sensing a voltage on the node at a plurality of times during the read operation, wherein the voltage on the node is sensed at least one time for each gate voltage applied to the gate of the transistor, and determining a logic state of a multi-level memory cell coupled with the digit line based at least in part on sensing the voltage on the node at each of the plurality of times during the read operation.

The method may include biasing the digit line to a first voltage by discharging the multi-level memory cell onto the digit line before biasing the gate of the transistor to the plurality of gate voltages and transferring, using the transistor, a charge between the digit line and the node based at least in part on the first voltage being less than a first gate voltage of the plurality of gate voltages of the gate of the transistor. In some examples, the gate of the transistor is biased to a respective gate voltage of the plurality of gate voltages before sensing the voltage on the node at one of the plurality of times. In some examples, a quantity of the plurality of times the voltage on the node is sensed during the read operation is associated with a quantity of logic states the multi-level memory cell is configured to store.

An apparatus is described. The apparatus may include means for biasing a gate of a transistor to a plurality of gate voltages during a read operation, the transistor coupled with a digit line and a node of a sense component, means for sensing a voltage on the node at a plurality of times during the read operation, wherein the voltage on the node is sensed at least one time for each gate voltage applied to the gate of the transistor, and means for determining a logic state of a multi-level memory cell coupled with the digit line based at least in part on sensing the voltage on the node at each of the plurality of times during the read operation.

The apparatus may include means for biasing the digit line to a first voltage by discharging the multi-level memory cell onto the digit line before biasing the gate of the transistor to the plurality of gate voltages and means for transferring, using the transistor, a charge between the digit line and the node based at least in part on the first voltage being less than a first gate voltage of the plurality of gate voltages of the gate of the transistor.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:
1. A method, comprising:
biasing a gate of a transistor to a first voltage during a read operation, the transistor coupled with a digit line and a node of a sense component;
sensing a precharge voltage on the node based at least in part on biasing the gate of the transistor to the first voltage;
biasing the gate of the transistor to a second voltage based at least in part on sensing the precharge voltage on the node;
sensing a third voltage on the node when the gate of the transistor is biased to the second voltage, the third voltage being different than the precharge voltage; and
determining a logic state of a multi-level memory cell coupled with the digit line based at least in part on sensing the third voltage.
2. The method of claim 1, further comprising:
biasing the digit line to a fourth voltage by discharging the multi-level memory cell onto the digit line; and
transferring, using the transistor, a charge to the node based at least in part on the fourth voltage being less than the second voltage on the gate of the transistor.
3. The method of claim 1, further comprising:
activating a second transistor coupled with the gate of the transistor, wherein biasing the gate of the transistor to the second voltage is based at least in part on activating the second transistor.

4. The method of claim 3, further comprising:
deactivating the second transistor after biasing the gate of the transistor to the second voltage, wherein the second transistor is configured to compensate for a threshold voltage associated with the transistor.

5. The method of claim 1, further comprising:
identifying when the third voltage is sensed during the read operation, wherein determining the logic state of the multi-level memory cell is based at least in part on when the third voltage is sensed during the read operation.

6. The method of claim 1, further comprising:
precharging, using a voltage source coupled with the node, the node to the precharge voltage before biasing the gate of the transistor to the first voltage.

7. The method of claim 1 wherein sensing the third voltage on the node comprises:
comparing the third voltage sensed on the node to a fixed reference voltage, wherein determining the logic state of the multi-level memory cell is based at least in part on the comparison.

8. An apparatus, comprising:
a multi-level memory cell coupled with a digit line and configured to store three or more states;
a sense component configured to determine a state stored on the multi-level memory cell by sensing a voltage associated with the digit line a plurality of times during a read operation; and
a transistor coupled with the digit line and the sense component and configured to transfer a charge between the digit line and the sense component during the read operation of the multi-level memory cell, wherein a gate of the transistor is biased to a plurality of gate voltages during the read operation, and wherein a logic state of the multi-level memory cell is based at least in part on a first voltage on the gate of the transistor when a second voltage is sensed by the sense component.

9. The apparatus of claim 8, further comprising:
a second transistor coupled with the gate of the transistor and configured to apply the first voltage to the gate of the transistor based on a threshold voltage associated with the transistor.

10. The apparatus of claim 9, wherein the multi-level memory cell is configured to bias the digit line to a third voltage by discharging onto the digit line, wherein the transistor is configured to transfer the charge to the sense component based at least in part on the third voltage being less than the first voltage.

11. The apparatus of claim 10, wherein the second transistor is configured to bias the gate of the transistor to a fourth voltage based at least in part on the first voltage being less than the third voltage.

12. The apparatus of claim 10, wherein the sense component is configured to determine the logic state of the multi-level memory cell based at least in part on the transistor transferring the charge to the sense component.

13. The apparatus of claim 8, wherein a quantity of the plurality of times the voltage of the sense component is sensed during the read operation is one less than a quantity of logic states the multi-level memory cell is configured to store.

14. The apparatus of claim 8, further comprising:
a voltage source coupled with a node of the sense component, wherein the voltage source is configured to precharge the node before the read operation of the multi-level memory cell.

15. The apparatus of claim 8, wherein the transistor is configured to transfer the charge between the digit line and the sense component based at least in part on the logic state of the multi-level memory cell.

16. A method, comprising:
biasing a digit line to a first voltage by discharging a multi-level memory cell onto the digit line before biasing a gate of a transistor to a plurality of gate voltages;
biasing the gate of the transistor to the plurality of gate voltages during a read operation, the transistor coupled with a digit line and a node of a sense component;
transferring, using the transistor, a charge between the digit line and the node based at least in part on the first voltage being less than a first gate voltage of the plurality of gate voltages of the gate of the transistor;
sensing a voltage on the node at a plurality of times during the read operation, wherein the voltage on the node is sensed at least one time for each gate voltage applied to the gate of the transistor; and
determining a logic state of a multi-level memory cell coupled with the digit line based at least in part on sensing the voltage on the node at each of the plurality of times during the read operation.

17. The method of claim 16, wherein the gate of the transistor is biased to a respective gate voltage of the plurality of gate voltages before sensing the voltage on the node at one of the plurality of times.

18. The method of claim 16, wherein a quantity of the plurality of times the voltage on the node is sensed during the read operation is associated with a quantity of logic states the multi-level memory cell is configured to store.

* * * * *